United States Patent
O'Brien

(10) Patent No.: US 7,571,419 B2
(45) Date of Patent: Aug. 4, 2009

(54) METHODS AND SYSTEMS FOR PERFORMING DESIGN CHECKING USING A TEMPLATE

(75) Inventor: Sean C. O'Brien, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 184 days.

(21) Appl. No.: 11/673,225

(22) Filed: Feb. 9, 2007

(65) Prior Publication Data

US 2008/0195994 A1 Aug. 14, 2008

(51) Int. Cl.
*G06F 17/50* (2006.01)
(52) U.S. Cl. .......................................... 716/19; 716/10
(58) Field of Classification Search .................... 716/10, 716/19
See application file for complete search history.

(56) References Cited

U.S. PATENT DOCUMENTS

| | | | |
|---|---|---|---|
| 2004/0225986 A1* | 11/2004 | Lin et al. | 716/10 |
| 2007/0055953 A1* | 3/2007 | Fang et al. | 716/19 |
| 2007/0288878 A1* | 12/2007 | Tai et al. | 716/12 |

\* cited by examiner

*Primary Examiner*—Jack Chiang
*Assistant Examiner*—Magid Y Dimyan
(74) *Attorney, Agent, or Firm*—Wade J. Brady, III; Frederick J. Telecky, Jr.

(57) ABSTRACT

A design application improves design checking by utilizing a template. During the checking process, the design application divides the design layout into regions. To further improve processing speed, the design application utilizes the template. The template maps the location of the regions of a design layout during a checking process. The template comprises information such as the dimensions and location of the regions in human-readable form. Because the human-readable template is computationally simple to process, the design application may locate, divide, manage, and merge the regions of the design layout more quickly.

18 Claims, 2 Drawing Sheets

METHODS AND SYSTEMS FOR PERFORMING DESIGN CHECKING USING A TEMPLATE

FIELD

The invention relates generally to systems and methods for semiconductor manufacture.

BACKGROUND

In semiconductor manufacture, large scale electronic devices are designed, and then the design is checked to insure that the devices will function properly. This check usually consists of a computer based analysis to determine if the design conforms to manufacturing parameters. Several different design checks include design rule checking (DRC) and optical proximity correction (OPC).

DRC determines whether a particular design layout satisfies a series of recommended parameters called design rules. Typically, the design rules are a series of parameters governed by semiconductor manufacturing that enable a designer to verify the correctness of a layout and/or photomask set. For example, design rules may specify certain geometric and connectivity restrictions to ensure sufficient margins to account for variability in semiconductor manufacturing processes. The design rule check ensures that most of the parts work correctly. As manufacturing increases in complexity, design rules have become increasingly more complex with each subsequent generation of semiconductor design.

DRC usually takes, as input, a layout in the GDSII standard format. GDSII format represents the design layout in a binary format for representation of planar geometric shapes, text labels, and some other information in hierarchical form. The DRC produces a report of design rule violations to allow a finalized design to be produced.

OPC is a photolithography enhancement technique commonly used to compensate for image errors due to diffraction or process effects of photolithography. For example, OPC may discover and correct such effects as differences between features in regions of different density (e.g., center vs. edge of an array, or nested vs. isolated lines), and line end shortening (e.g., gate overlap on field oxide).

DRC and OPC are computationally intense tasks. If run on a single CPU, designers may have to wait up to a week to get the result of a DRC or OPC for modern high; density designs. Accordingly, methods and systems are needed to speed up design checking processes.

SUMMARY

An embodiment is directed to a method of creating a design layout. The method comprises creating a template. The template maps locations of regions of the design layout. The method further comprises dividing the design layout into the regions based on the template, wherein the regions comprise text data. The method further comprises analyzing the regions of the divided design layout, and merging the analyzed regions using a text processing algorithm and the template. The template comprises data in human-readable form.

Another embodiment is directed to a system for creating a design layout. The system comprises a processor and an application configured for execution by the processor comprising program instructions for creating a template, wherein the template maps locations of regions of the design layout; dividing the design layout into the regions based on the template, wherein the regions comprise text data; analyzing the regions of the divided design layout; and merging the analyzed regions using a text processing algorithm and the template, wherein the template comprises data in human-readable form.

Another embodiment is directed to a computer readable medium containing instruction for causing a processor to perform a method of creating a design layout. The method comprises creating a template. The template maps locations of regions of the design layout. The method further comprises dividing the design layout into the regions based on the template, wherein the regions comprise text data. The method further comprises analyzing the regions of the divided design layout, and merging the analyzed regions using a text processing algorithm and the template. The template comprises data in human-readable form.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the disclosure and together with the description, serve to explain the principles of the embodiments.

DETAILED DESCRIPTION

Embodiments of the present disclosure improve design checking by utilizing a template. During the checking process, a design application divides the design layout into regions. Each region comprises text data describing the semiconductor features contained in the region. By dividing the layout into regions, the design application may utilize different processors for each region. To further improve processing speed, the design application utilizes a template. The template maps the location of the regions of a design layout during a checking process. The template comprises information such as the dimensions and location of the regions in human-readable form.

Each region is separate and individual and may be processed accordingly. After processing, the regions are merged to form an output design layout. Since the regions contain text data, the regions may be merged using a simple text combination without subsequent data processing. Because the human-readable template and text data are computationally simple to process, the design application may locate, divide, manage, and merge the regions of the design layout more quickly.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
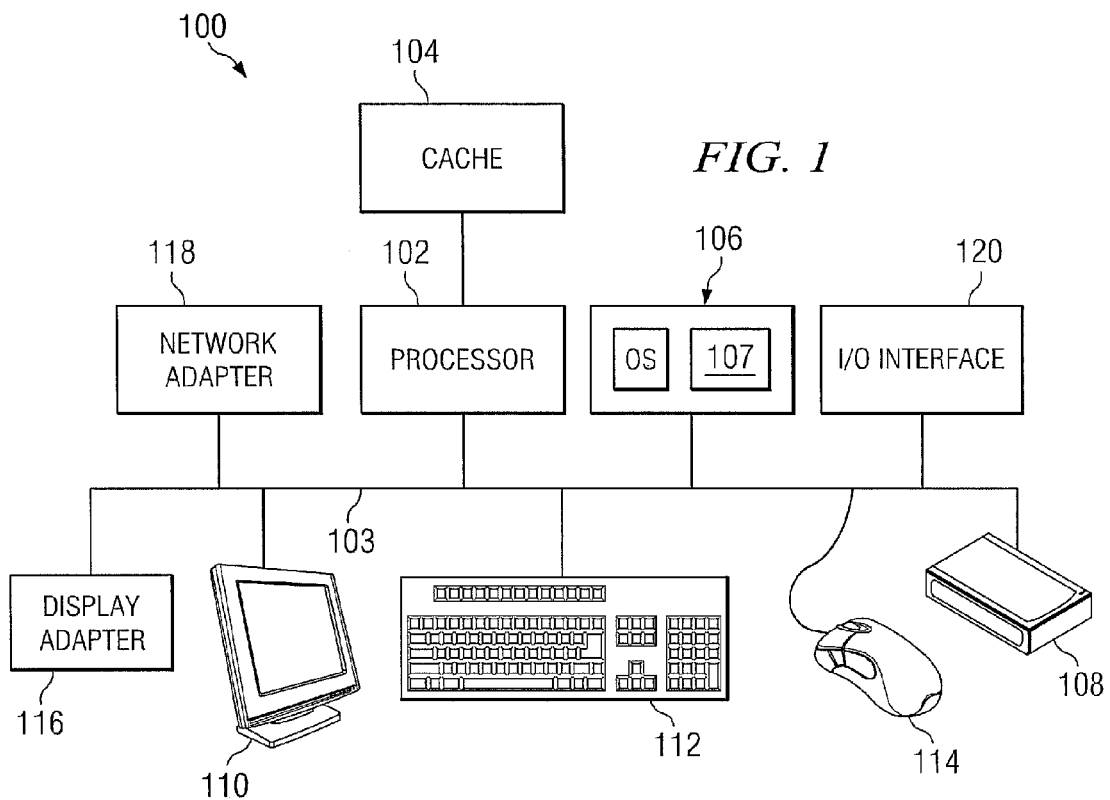
FIG. 1 is a diagram illustrating a computing platform consistent with embodiments of the present disclosure.

FIG. 1 is a block diagram of an exemplary computing platform 100 capable of performing embodiments of the present disclosure. Computing platform 100 may be utilized to perform the methods of the present disclosure.

As shown in FIG. 1, computing platform 100 may include components such as a processor 102, a cache 104, a memory 106, a secondary memory 108, a display 110, a keyboard 112, a mouse 114, a display adaptor 116, a network adaptor 118, and input/output (I/O) interface 120. Each of these components may be coupled and communicate via a bus 103.

Processor 102 may be embodied in one or more processors. Processor 102 provides an execution platform for applications performing methods of the present disclosure. Commands and data from the processor 102 may be communicated over communication bus 103 to and from main memory 106. Main memory 106 may be, for example, a Random Access Memory (RAM). Main memory 106 may store an operating system (OS).

Main memory 106 may also store a design application 107 implementing the methods of the present disclosure, which may be executed during runtime by processor 102. Design application 107 may be written in program code and executed by the computing platform 100. Design application 107 may be implemented in computer languages such as PASCAL, C, C++, JAVA, HTML and the like. One skilled in the art will realize that the methods described above may be implemented in any computer language and any application capable of designing semiconductor devices.

Additionally, one skilled in the art will realize that design application 107 may be embodied on any computer readable storage medium as instruction for causing computer platform 100 to perform the instructions. The computer readable storage medium may include storage devices and signals, in compressed or uncompressed form. Exemplary computer readable signals, whether modulated using a carrier or not, are signals that a computer system hosting or running the present invention can be configured to access, including signals downloaded through the Internet or other networks. Concrete examples of the foregoing include distribution of executable software programs of the computer program on a CD-ROM or via Internet download. In a sense, the Internet itself, as an abstract entity, is a computer readable medium. The same is true of computer networks in general.

Likewise, design application 107 implementing the method of the present disclosure may be stored on secondary memory 108. Secondary memory 108 may include, for example, one or more of a hard disk drive and/or a removable storage drive, a floppy diskette drive, a magnetic tape drive, a compact disk drive, and the like. Computer platform 100 may read from and/or write to secondary memory 108. Likewise, secondary memories 108 may read from and/or write between themselves in a well-known manner.

Users of computing platform 100 may interface with and control computing platform 100 utilizing keyboard 112 and mouse 114. Computing platform 100 may utilize display 110 and display adapter 116 to output data, such as the mask layout, for viewing by the users. For example, display adapter 116 may receive display data from the processor 102 and convert the display data into display commands for display 110.

Network adapter 118 may allow computing platform 100 to send and receive data via a network. Additionally, I/O interface 120 may allow computing platform 100 to input data from and output data to other electronic devices. For example, I/O interface 120 may be coupled to a lithographic apparatus for receiving semiconductor design data and transmitting the results of the methods of the present disclosure.

Design application 107 accepts a design layout in order to perform design checking. Design layouts utilized by design application 107 may be computer files including information about a semiconductor design such as the type, size, shape, and location of features in the layout. Exemplary features in the design layout may be transistors, lines, holes vias, or the like. The design layout may be in either machine-readable form such as GDS or human-readable form, such as text data. Design application 107 may also convert the machine-readable form into human-readable form, such as text data.

Design application 107 performs design checking in order to achieve a high overall yield and reliability for the semiconductor design. If design rules or photolithography rules are violated, the design may not be functional. As such, design application 107 verifies that the design layout meets the process constraints for a given design type and process technology. Design application 107 may perform simple measurement and Boolean checks, modify existing features, insert new features, and check the entire design for process limitations such as layer density. Design application 107 produces a final layout which may consist not only of data representing the semiconductor features of the design, but also data that provide support for manufacture of the design.

Typically, a design layout may be complex including many different types of semiconductor devices. Processing an entire layout on a single computing platform 100 may require large amounts of time. In order to speed design checking, a design layout may be divided into multiple regions. Then, design application 107 may process the different regions utilizing separate computing platforms 100 or separate processors 102 in a single computing platform 100. After the regions are processed, design application 107 recombines the regions of the design layout in a single design layout.

Figure 2A:
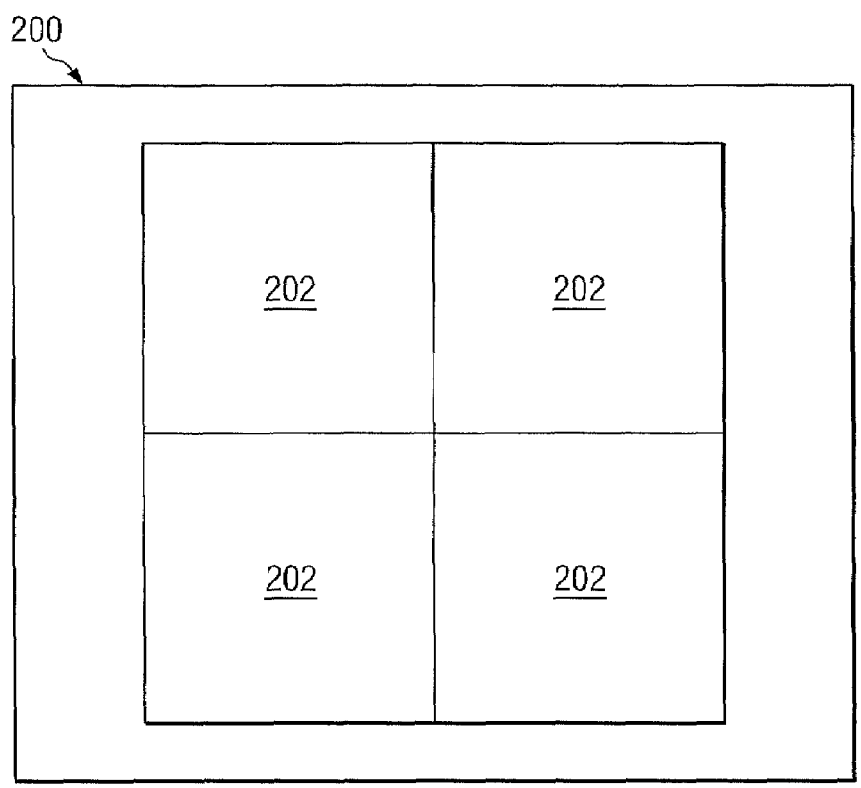
FIGS. 2A and 2B are diagrams illustrating a design layout and checking process consistent with embodiments of the present disclosure.
Figure 2B:
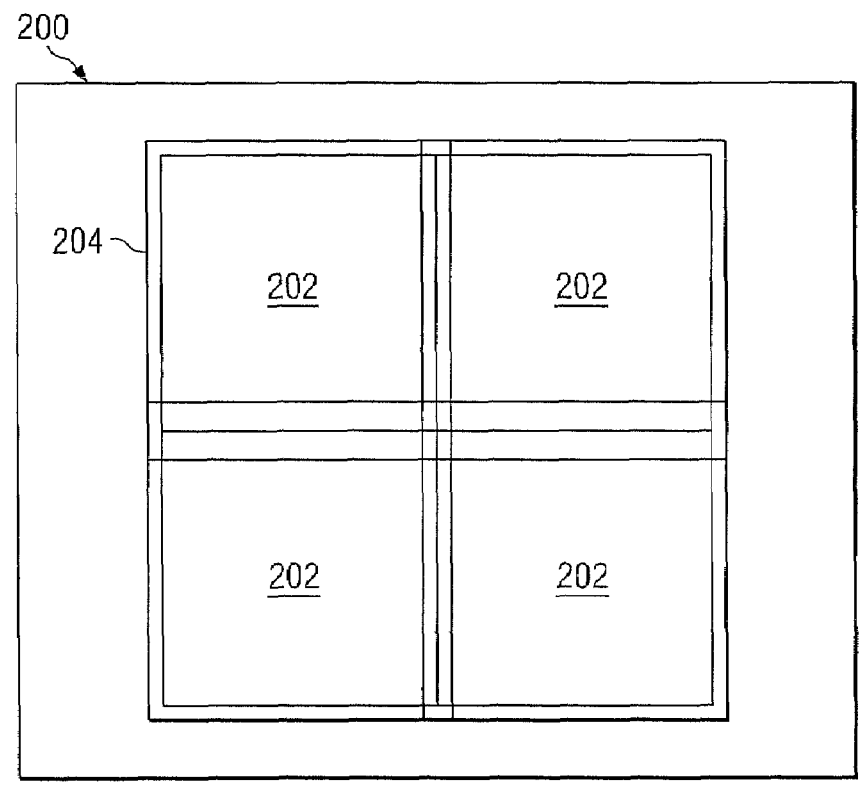

FIGS. 2A and 2B are diagrams illustrating an exemplary design layout divided into regions in order increase design checking processing speed. As shown in FIG. 2A, a design layout 200 may be divided into regions 202. FIG. 2A illustrates design layout 200 divided into four, square regions. One skilled in the art will realize that regions 202 may be any number, dimension, or configuration and may be a function of the particular design layout.

When design application 107 divides design layout 200 into regions 202, errors may be created when the regions are recombined. For example, a particular feature in design layout 200 may be divided between two or more regions. As such, design application 107 may produce a different solution for each piece of the divided feature. The solution would be a design layout which meets the design rules of the checking process. As illustrated in FIG. 2B, in order to improving design checking, each region 202 may be biased by an amount 204. The bias includes a portion of an adjacent region. By including a bias, design application 107 may improve design checking because features that span regions 202 may be included in the separate regions 202 in the bias and design application may assign the same solution for each region. One skilled in the art will realize that bias 204 may be any size in order to improve the design checking process.

Although checking speed may be improved by dividing a design layout into multiple regions for separate processing, recombining the regions may require significant time due to the complexity of the design layout. Typically, the design layout may include complex information which requires computationally intense analysis to recombine the regions. Embodiments of the present disclosure further improve design checking by utilizing a template. The template maps, in human-readable form, the location of the regions of a design layout during a checking process.

Further, to improve checking, the design layout and the regions of the design layout may be embodied in text data. As such, each region is separate and individual and may be processed accordingly. Since the regions contain text data, the regions may be merged using a simple text combination without subsequent data processing.

Figure 3:
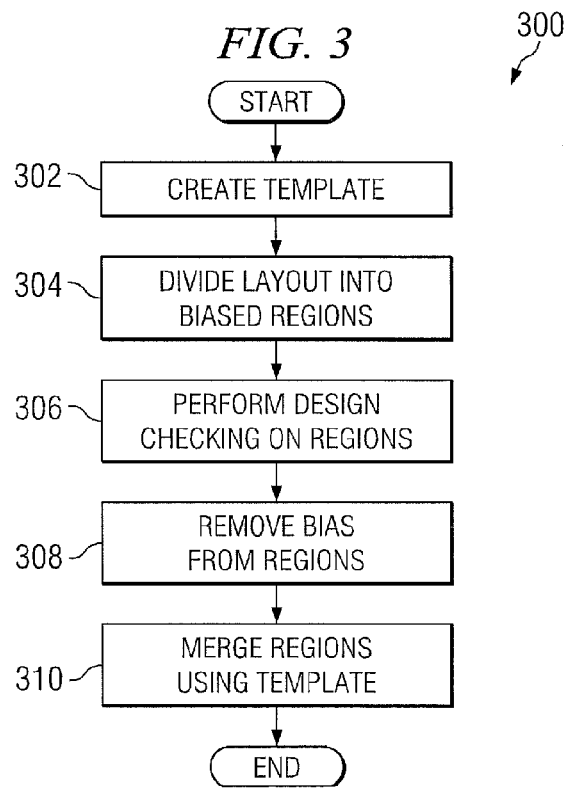
FIG. 3 is a flow diagram illustrating a design checking process utilizing a template consistent with embodiments of the present disclosure.

FIG. 3 is a flow diagram illustrating a method 200 utilized by design application 107 for improving design layout creation. Design application 107 improves the design process by utilizing a template during the design checking process. The template maps the location of the regions of a design layout during a checking process. The design map template comprises information such as dimension and location of the regions in human-readable form.

Further, the design application processes the design layout and regions of the design layout in which the semiconductor features are embodied in text data. After processing, design application 107 may combine the regions comprising text data using a simple text combination algorithm and the design map template. As such, design application 107 may locate, divide, and merge the regions of the design layout more quickly.

Method 300 begins with application 107 creating a template (stage 302). The template maps the location of the regions of a design layout during a checking process. The template may comprise the dimension and location of the regions in human-readable form.

For example, if design application 107 performs checking on design layout 200, design template may map the location of the four regions 202. In such an example, the design template may include information such as size of the regions, position of the regions, width and length of the region, manufacturing information such as phase, and the like.

Next, design application 107 divides the layout into regions and biases the regions (stage 304). Application 107 may divide the layout into regions of any size and shape depending on the layout. For example, if design application 107 performs checking on design layout 200, application 107 may divide and bias layout 107 as illustrated in FIG. 2.

Then, design application 107 performs a design checking process on each region (stage 306). Application 107 may perform design checking processes such as DRC or OPC. For example, if design application 107 performs checking on design layout 200, application 107 may compare features in regions 202 of layout 200 to a set of design rules and correct the features to comply with the design rules. One skilled in the art will realize that design application 107 may perform any type of well-known design checking process.

After performing the check, design application 107 removes the bias from the regions (stage 308). Design application 107 removes the bias by discarding the additional information included in each region. For example, if application 107 performs checking on design layout 200, application 107 may discard bias 204 included in regions 202.

Then, design application 107 merges the regions of the design layout utilizing the template (stage 310). Design application 107 examines the computationally easy, human-readable template to determine the location and dimension of the regions to recombine the regions into a single design layout. Optionally, design application may include the template in the final design layout to provide a map to the design layout.

Further, the regions may comprise text data. As such, design application 107 may merge the regions by a simple concentration of the individual regions. Design application 107 may concentrate the regions using a text processing algorithm. One skilled in the art will realize that design application 107 may utilize any well-known text processing algorithm for combining text data. Accordingly, design application 107 may merge the regions without subsequent data processing.

In method 300 described above, design application 107 creates the template at the beginning of the process. One skilled in the art will realize that design application 107 may create the template at any point during the process prior to merging the regions.

Other embodiments of the present teaching will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of creating a design layout, comprising:
   creating a template by a processor, wherein the template maps locations of a plurality of regions of the design layout, wherein a boundary of each region is defined by a perimeter;
   dividing the design layout into the regions based on the template, wherein each of the plurality of regions comprises text data within the perimeter;
   analyzing the regions of the divided design layout; and
   merging the analyzed regions using a text processing algorithm and the template,
   wherein the template comprises data in human-readable form.

2. The method of claim 1, further comprising:
   adding a bias having a width to the perimeter of each region prior to analyzing the regions, wherein the bias includes a portion of an adjacent region.

3. The method of claim 2, further comprising:
   removing the bias from the regions after analyzing the regions.

4. The method of claim 1, wherein analyzing the regions comprises determining whether features of the design layout meet a design rule.

5. The method of claim 1, wherein analyzing the regions comprises performing optical proximity correction.

6. The method of claim 1, further comprising appending the template to the design layout.

7. A system for creating a design layout, the system comprising:
a processor; and
an application configured for execution by the processor comprising program instructions for creating a template, wherein the template maps locations of a plurality of regions of the design layout, wherein a boundary of each region is defined by a perimeter; dividing the design layout into the regions based on the template, wherein each of the plurality of regions comprises text data within the perimeter; analyzing the regions of the divided design layout; and merging the analyzed regions using a text processing algorithm and the template, wherein the template comprises data in human-readable form.

8. The system of claim 7, wherein the application configured for execution by the processor further comprises program instructions for adding a bias to the regions prior to analyzing the regions, wherein the bias includes a portion of an adjacent region.

9. The system of claim 8, wherein the application configured for execution by the processor further comprises program instructions for removing the bias from the regions after analyzing the regions.

10. The system of claim 7, wherein the application configured for execution by the processor further comprises program instructions for determining whether features of the design layout meet a design rule.

11. The system of claim 7, wherein the application configured for execution by the processor further comprises program instructions for performing optical proximity correction.

12. The system of claim 7, wherein the application configured for execution by the processor further comprises program instructions for appending the template to the design layout.

13. A computer storage device containing instruction for causing a processor to perform a method of creating a design layout, the method comprising:
creating a template, wherein the template maps locations of a plurality of regions of the design layout, wherein a boundary of each region is defined by a perimeter;
dividing the design layout into the regions based on the template, wherein each of the plurality of regions comprises text data within the perimeter;
analyzing the regions of the divided design layout; and
merging the analyzed regions using a text processing algorithm and the template,
wherein the template comprises data in human-readable form.

14. The computer storage device of claim 13, the method further comprising:
adding a bias having a width to the perimeter of each region prior to analyzing the regions, wherein the bias includes a portion of an adjacent region.

15. The computer storage device of claim 14, the method further comprising:
removing the bias from the regions after analyzing the regions.

16. The computer storage device of claim 13, wherein analyzing the regions comprises determining whether features of the design layout meet a design rule.

17. The computer storage device of claim 13, wherein analyzing the regions comprises performing optical proximity correction.

18. The computer storage device of claim 13, the method further comprising appending the template to the design layout.

* * * * *